United States Patent [19]

Vilmur et al.

[11] Patent Number: 4,602,218
[45] Date of Patent: Jul. 22, 1986

[54] AUTOMATIC OUTPUT CONTROL CIRCUITRY FOR RF POWER AMPLIFIERS WITH WIDE DYNAMIC RANGE

[75] Inventors: Richard J. Vilmur, Palatine; Robert F. D'Avello, Hoffman Estates, both of Ill.

[73] Assignee: Motorola, Inc., Schaumburg, Ill.

[21] Appl. No.: 729,016

[22] Filed: Apr. 30, 1985

[51] Int. Cl.[4] .............................................. H03G 3/30
[52] U.S. Cl. .................................... 330/279; 330/129
[58] Field of Search ................... 330/129, 207 P, 278, 330/279, 284, 298; 455/115, 117, 234, 245

[56] References Cited

U.S. PATENT DOCUMENTS

| | | | |
|---|---|---|---|
| 3,449,680 | 6/1969 | Schilb et al. | 455/117 |
| 3,496,415 | 2/1970 | Ruthenburg et al. | 330/207 P |
| 3,641,451 | 2/1972 | Hollingsworth et al. | 330/207 P |
| 3,646,397 | 2/1972 | Ruthenburg et al. | 330/207 P X |
| 3,651,379 | 3/1972 | Moisand et al. | 330/207 P X |
| 3,671,878 | 6/1972 | Becker | 330/207 P |
| 3,866,136 | 2/1975 | Augustin et al. | 330/207 P |
| 3,988,644 | 10/1976 | Krone | 330/207 P X |
| 4,019,150 | 4/1977 | Lurey et al. | 330/207 P X |
| 4,041,396 | 8/1977 | Fedde | 330/207 P X |
| 4,114,108 | 9/1978 | Faulkenberry et al. | 330/207 P |
| 4,122,400 | 10/1978 | Medendorp et al. | 330/207 P |
| 4,146,847 | 3/1979 | Otao et al. | 330/207 P X |
| 4,287,466 | 9/1981 | Quick | 330/207 P X |
| 4,313,210 | 1/1982 | Hume et al. | 455/117 |
| 4,373,206 | 2/1983 | Suzuki et al. | 455/103 |
| 4,392,245 | 7/1983 | Mitama | 455/115 |
| 4,446,440 | 5/1984 | Bell | 330/10 |
| 4,447,783 | 5/1984 | Quick | 455/117 X |
| 4,476,437 | 10/1984 | Fujiwara | 330/279 X |
| 4,546,326 | 10/1985 | Van Uffelen et al. | 330/279 X |

OTHER PUBLICATIONS

Equipment Manual "Advanced Mobile Phone System" No. 68P81039E25-A, Motorola, Inc. 8/17/79.
Type Acceptance Authorization: B2J8Q5UM1043, from FCC to OKI Advanced Communications, 12/30/81, FIG. 3-2.
Type Acceptance Authorization: ACK7IAEF001, from FCC to Matsushita Communication Industrial Co., Ltd., 8/30/83 pp. 3-8 to 3-13 and FIG. EF-61-04EA.
Type Acceptance Authorization: DZP9WNTX30A, from FCC to Harris Corp. 7/30/84 FIG. 1 4 et seq.

Primary Examiner—Eugene R. LaRoche
Assistant Examiner—Steven J. Mottola
Attorney, Agent, or Firm—Raymond A. Jenski; Rolland R. Hackbart

[57] ABSTRACT

Automatic power output control circuitry is disclosed in which the magnitude of a radio frequency signal is maintained at one of a plurality of magnitudes selected in response to control signals. The radio frequency signal output from a variable output amplifier is sampled and the sample is further amplified and the dynamic range compressed prior to being rectified. The rectified power magnitude signal, which is nonlinearly related to the radio frequency signal magnitude, is adjusted by an adjustment factor selected by the control signals and employed in varying the output of the variable output amplifier to produce a corresponding radio frequency signal output magnitude.

23 Claims, 5 Drawing Figures

AUTOMATIC OUTPUT CONTROL CIRCUITRY FOR RF POWER AMPLIFIERS WITH WIDE DYNAMIC RANGE

BACKGROUND OF THE INVENTION

The present invention is related generally to control circuits for radio frequency (RF) signal power amplifiers, and more particularly to improved automatic power output control circuitry for RF signal power amplifiers having a wide dynamic range.

Generally, radio frequency power amplifiers are operated at one output power level, and such power amplifiers are adjusted during manufacture to the desired output power level. In some applications, it has been desirable to have two power levels, a high and a low level. The RF signal power amplifier for such applications would have one setting for the high power level and another for the low power level. In many instances, these power amplifiers have control circuitry which prevents an excess of high applied voltage from the power supply, a large antenna mismatch, or an extreme of environment from destroying the active devices which comprise the power amplifier.

Recently, it has become advantageous to reuse radio channels in some radio communications systems. In order to avoid interference between two RF signal power amplifiers using the same frequency, it is desirable to have many different selectable output power levels, one of which is chosen for optimum communication efficiency of each RF signal power amplifier with a minimum of interference to other power amplifiers. For example, four power levels are available in the RF signal power amplifier employed in the mobile radio telephone described in Motorola instruction manual no. 68P81039E25, entitled "Advanced Mobile Phone System", and published by Motorola Service Publications, 1301 E. Algonquin Road, Schaumburg, Ill. 1979. The four power levels produced therein are achieved by varying reference voltage which is applied to an automatic output control circuit.

Additionally, RF power amplifier having eight power levels and an associated power control circuit has been disclosed in U.S. patent application No. 491,499 filed in behalf of Walczak et al. on May 4, 1983 and assigned to the assignee of the present invention. Since the absolute level of each of the eight power levels employed therein must be maintained relatively constant, the control circuitry must be temperature compensated to prevent drift of the power level of each power level over extremes of temperature. This temperature compensation has been achieved by the use of separate and discrete temperature compensating elements which add to the complexity of the control circuit.

SUMMARY OF THE INVENTION

Therefore, it is an object of the present invention to provide an improved automatic output control circuit for an RF signal power amplifier which accurately maintains a selected power output over a wide range of RF signal frequencies and temperatures without the added complexity of a temperature compensation network.

It is a further object of the present invention to enable selection of one of a plurality of power output levels in response to control signals.

Accordingly, the present invention of an automatic output control circuitry achieves these objectives. The present invention controls the magnitude of an RF signal amplified by an amplifier having a variable output. A sample of the RF signal is obtained and nonlinearly amplified before being employed by a power magnitude signal generator to generate a power magnitude signal related to the amplified RF signal. The power magnitude signal is adjusted by an adjustment factor selected by the control signals and the variable output amplifier is varied in response to the adjusted power magnitude signal to produce a corresponding RF signal output magnitude.

DETAILED DESCRIPTION OF THE PREFERRED EMBODIMENT

Figure 1:
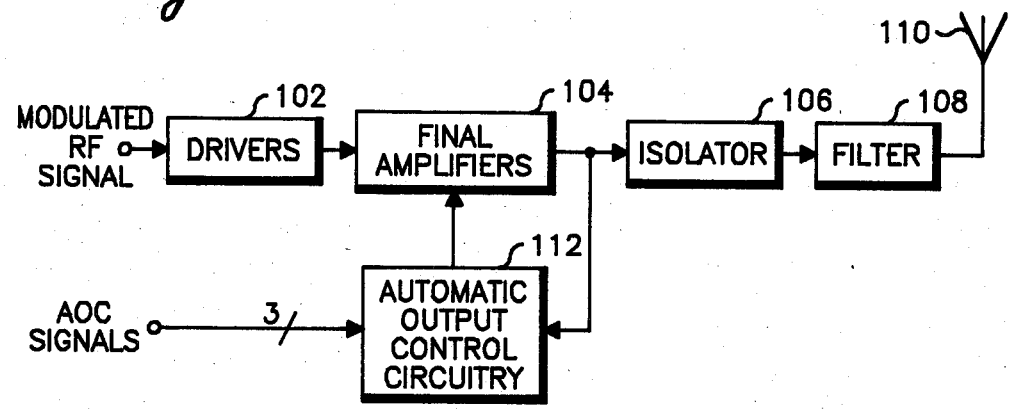
FIG. 1 is a block diagram of an RF signal amplifier including the automatic output control circuitry of the present invention.

Referring to FIG. 1, there is illustrated an RF signal power amplifier which may advantageously utilize automatic output control (AOC) circuitry. An RF signal power amplifier is typically part of a radio transmitter, such as that described in the aforementioned instruction manual no. 68P81039E25, that includes an RF signal power amplifier for amplifying a modulated RF signal which is radiated by an antenna. The RF signal power amplifier in FIG. 1 includes two cascaded blocks of amplification, drivers 102, and final amplifiers 104. The output of final amplifier 104 is coupled via isolator 106 and filter 108 to antenna 110. The output power level developed by final amplifiers 104 is proportional to the drive current applied by AOC circuit 112 thereto and may amplify an input modulated RF signal from approximately ¼th watt to 5 or more watts.

AOC circuitry 112 in FIG. 1 determines the magnitude of the RF signal from final amplifiers 104 and varies the drive current applied to final amplifiers 104 for maintaining the magnitude of the final amplifier output at one of several predetermined magnitudes selected by a plurality of AOC signals. In the preferred embodiment, three AOC signals are used to select one of eight different output power levels ranging from 8 milliwatts to 5 watts, a dynamic range of 28 dB. The AOC circuitry of the present invention accurately controls the output power level over a wide range of RF signal frequencies and over the commercial environmental range.

Figure 2:
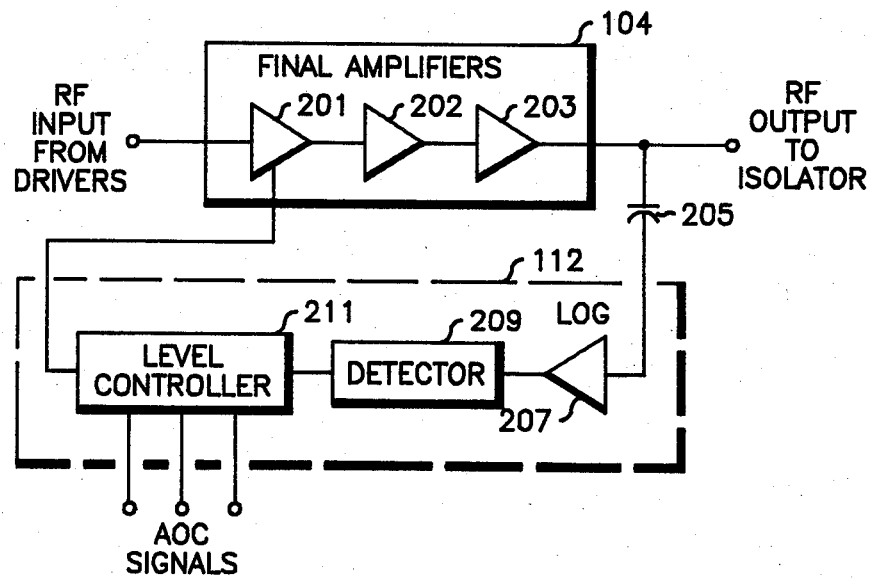
FIG. 2 is a block diagram of the automatic control circuitry, the final amplifiers, and the coupling therebetween.

In FIG. 2, further detail of the block diagrams of the final amplifiers 104 and automatic output control circuitry 112 are revealed. In the preferred embodiment, final amplifiers 104 comprise three solid state active devices in a conventional RF configuration. The gain of the first final amplifier 201 is conventionally a function of the applied supply current. The amplified RF signal is then applied to final driver 202 and then to final amplifier 203 which applies a fixed gain to the variable output of final 201 thereby generating the RF output power for the final amplifier 104.

A sample of the RF output from final amplifier 104 is derived by coupling capacitor 205 and the sample signal, which may have a signal magnitude 12 dB less than the magnitude of the RF output magnitude, is coupled to automatic output control circuitry 112. (Coupling may be achieved by other means, such as a directional coupler or energy field probe, and the method used need not limit the scope of the present invention).

The automatic output control circuitry 112 consists primarily of the three functions shown in block diagram form in FIG. 2. The sample signal is applied to amplifier 207 (which in the preferred embodiment is a logarithmic amplifier) which provides a nonlinear gain function such that low level magnitudes of the sample signal are amplified more than high level sample signals. Thus, the output of amplifier 207 provides an output which is logarithmically related to the magnitude of the input sample signal thereby providing a compression of the dynamic range of the sample signal. The detector 209 is thus presented with an amplified sample signal having a compressed dynamic range. It should be noted that the function of logarithmic amplifier 207 may be achieved by other signal compression means and the invention described herein is not limited thereto.

The detector 209 converts the amplified and compressed sample signal to a direct current signal representative of the RF power output which can be termed a power magnitude signal. The power magnitude signal is coupled to a level controller 211 which employs the power magnitude signal and AOC control signals to produce the current control signal applied to amplifier 201 to control its gain.

Figure 3:
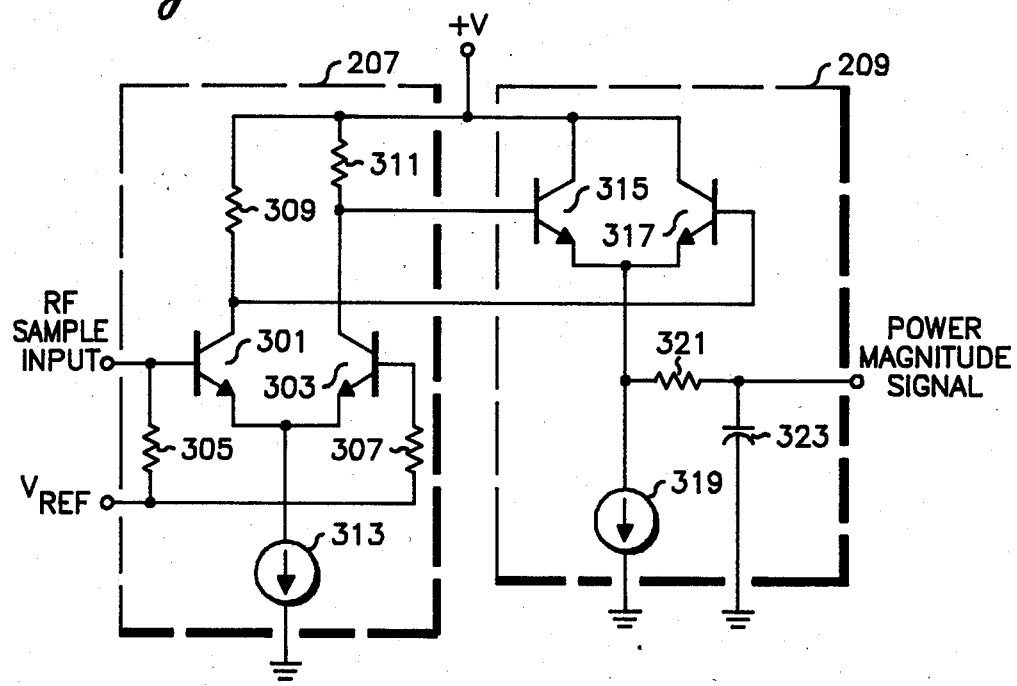
FIG. 3 is a schematic diagram of the amplifier and detector of the automatic output control circuitry employed by the present invention.

A detailed circuit schematic for amplifier 207 and detector 209 is shown in FIG. 3. Logarithmic amplifier 207, is realized using two transistors 301 and 303 in a differential pair configuration. In the preferred embodiment, these transistors are a MMBR901 available from Motorola, Inc., but may be equivalent transistors which are compatible with the frequency of operation. The sample signal is input to the base of transistor 301 and the logarithmically amplified sample is differentially output from the collectors of transistors 301 and 303. Base bias is supplied to the differential pair transistor 301 and 303 from $V_{ref}$ via resistors 305 and 307, respectively. Collector supply is via resistors 309 and 311. Current source 313 stablizes the amplifier and may be a resistor or a transistor arranged in current source configuration. Detector 209 is a differential pair full-wave rectifier comprising transistors 315 and 317 (which may also be MMBR901 transistors). The full-wave rectifier of transistors 315 and 317 is stablized by current source 319 and the direct current produced by the rectified sample signal is filtered by resistor 321 and capacitor 323 to become the output power magnitude signal. The dynamic range compression available from amplifier 207 enables the operation of full wave rectifier 209 in a range which eliminates the need for specific temperature compensation circuits.

Figure 4:
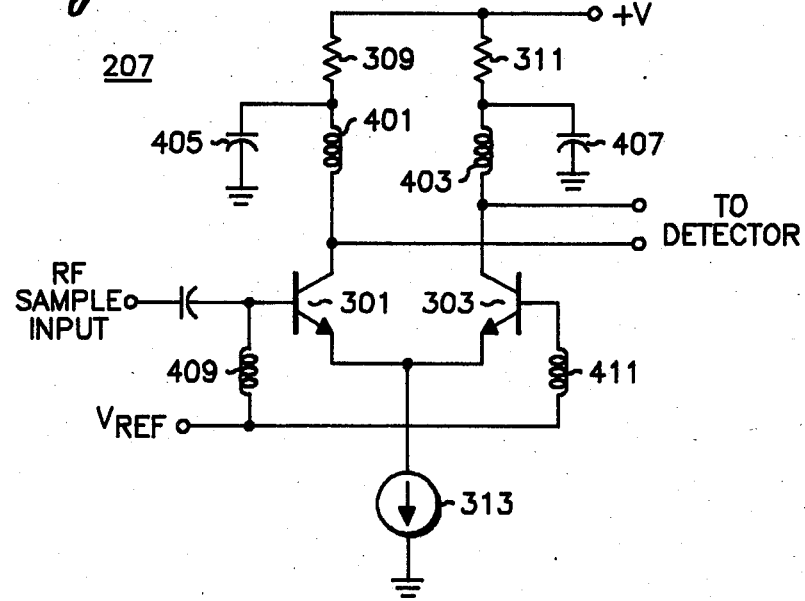
FIG. 4 is a schematic diagram of the amplifier of FIG. 3 in which modifications for high frequency operation have been made.

Amplifier 207 may be modified as shown in FIG. 4 for operation at high RF frequencies. This modification requires the addition of reactive elements for RF bias as shown. Inductors 401 and 403 and capacitors 405 and 407 in the collectors of transistors 301 and 303 provide conventional RF signal blocking. Additionally, inductors 409 and 411 provide RF signal block for the base reference voltage. These reactive elements may further be realized by transmission line techniques if desired by the designer.

Figure 5:
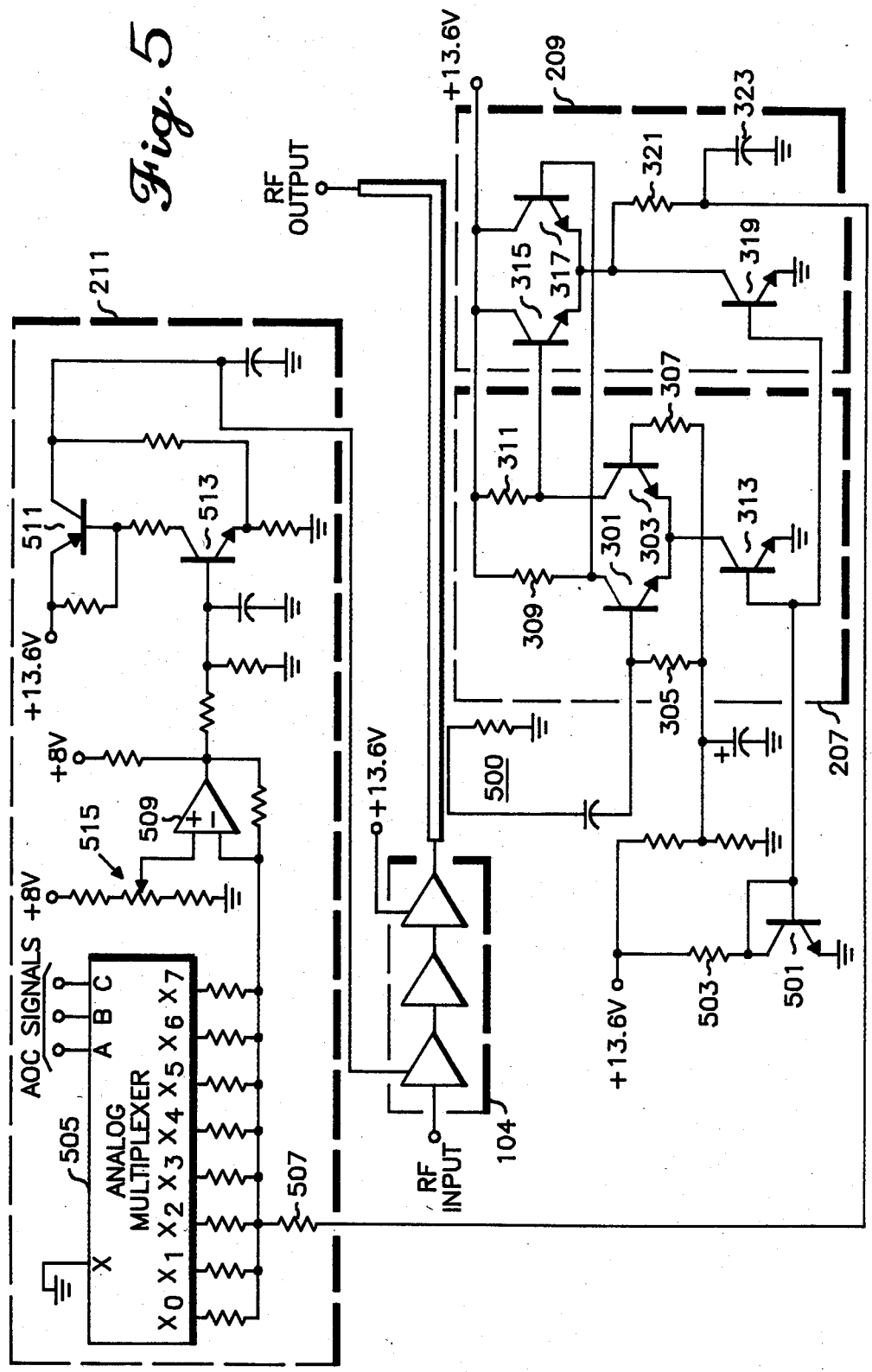
FIG. 5 is a detailed schematic diagram of the automatic output control circuitry employed in the present invention.

A detailed schematic of the automatic output control circuitry of the present invention is shown in FIG. 5. Here, the amplified RF signal is coupled to logarithmic amplifier 207 by a directional coupler 500. The logarithmic amplifier 207 and the detector 209 employ transistors as current sources 313 and 319. The current bias for the current sources is developed by transistor 501 and applied to the base of transistors 313 and 319. (These transistors may be any general purpose NPN silicon transistor such as a 2N3904). Supply for transistor 501 is through resistor 503. Inherent in the design of a differential amplifier with any current source is a natural shift in DC current with temperature. This DC current shift may be advantageously used to partially correct any effect of temperature on detector 209. For the preferred embodiment of FIG. 5, for example, if resistor 503 were selected to be a value of 2,400 ohms and resistors 309 and 311 were designed to 2,200 ohms each, the self correction with temperature is (0.5) (2,200/2,400) or 45.8%.

A detailed diagram of the AOC circuitry 112 is also shown in FIG. 5. Three AOC signals are coupled to analog multiplexer 505, which in the preferred embodiment is an MC14051 available from Motorola Inc., to select one of eight different resistors coupled to the $X_0$ to $X_7$ terminals of the analog multiplexer. Depending on the binary state of each of the AOC signals, one of the resistors is coupled through the analog multiplexer to ground. The selected resistor, working against resistors 507 and 321, forms an incrementally variable attenuator to attenuate the power magnitude signal by an amount equal to the ratio of the selected resistor and the series combination of resistors 507 and 321. AOC signals can be provided by a signal source such as the radio control circuitry described in the aforementioned instruction manual no. 68P81039E25.

The output of the variable attenuator is input to conventional operational amplifier 509. The operational amplifier is used as a comparator and controls the current amplifier 511 by way of base drive transistor 513. The drive current signal from current amplifier 511 is coupled to final amplifiers 104 for varying the power output of final amplifiers 104. The power output of final amplifier 104 is increased as the drive current signal increases, and vice versa.

The noninverting input of comparator 509 is coupled to a reference voltage provided by two resistors and variable resistor 515. During manufacture of the RF signal amplifier, variable resistor 515 is adjusted to enable the final amplifier 104 to provide the desired power output for the highest power level selection. Selection of other resistors by analog multiplexer 505 decrease the attenuation of the power magnitude signal thereby increasing the power magnitude signal available at the inverting input of comparator 509. In operation, the comparator 509 current control signal output varies the drive current signal from current amplifier 511 to maintain the magnitude of the attenuated power magnitude signal (at the inverting input of comparator 509) substantially the same as the magnitude of the reference voltage applied to the noninverting input. Because the magnitude signal has a compressed dynamic range, only the comparator op amp 509 is needed for level translation and the op amp 509 operates in a condition of continuously reducing its output signal.

The loop response time of AOC circuitry 112 is on the order of one millisecond. The loop turn-on time is primarily determined by the circuitry coupled to the base of transistor 513.

In summary, an improved automatic output control circuitry for a wide dynamic range RF signal power amplifier having a plurality of output power level steps has been described. The complexity and direct current amplification gain required for conventional RF power detection and control has been eliminated by the use of sample signal compression circuitry. The improved AOC circuitry of the present invention can be advantageously utilized in any suitable application where it is desired to accurately maintain the output of an RF power signal amplifier at a selected one of several output power levels. Therefore, while a particular embodiment of the present invention has been described and shown, it should be understood that the invention is not limited thereto since many modifications may be made by those skilled in the art. It is therefore contemplated to cover by the present application any and all modification that fall within the true spirit and scope of the basic underlying principles disclosed and claimed herein.

We claim:

1. Circuitry for controlling the magnitude of a radio frequency (RF) signal in response to control signals, comprising:
   means, having variable output, for amplifying the RF signal to an output magnitude and for obtaining a sample of said amplified RF signal;
   means, coupled to said means for obtaining a sample, for nonlinearly amplifying said sample of said amplified RF signal whereby small values of magnitude of said sample are amplified more than large values of sample magnitude;
   means, for rectifying said amplified sample to generate a power magnitude signal having a magnitude related to said RF signal output magnitude;
   means for adjusting said power magnitude signal by an adjustment factor selected by the control signals; and
   means, responsive to said adjusted power magnitude signal, for varying said variable output amplifying means to produce a corresponding RF signal output magnitude.

2. Circuitry in accordance with claim 1 wherein said means for nonlinearly amplifying further comprises a logarithric amplifier.

3. Circuitry in accordance with claim 1 wherein said means for obtaining a sample of said amplified RF signal is a coupling capacitor.

4. Circuitry in accordance with claim 1 wherein said means for obtaining a sample of said amplified RF signal is a directional coupler.

5. Circuitry in accordance with claim 1 wherein said means for rectifying further comprises means for full wave rectification of said amplified sample.

6. Circuitry in accordance with claim 1 wherein said means for adjusting said power magnitude signal further comprises means for attenuating said power magnitude signal by attenuation factors selected by the control signals.

7. Circuitry in accordance with claim 1 wherein said means for varying said variable output amplifying means further comprises a comparator and a current amplifier.

8. Control circuitry for maintaining the magnitude of a radio frequency (RF) signal from a RF signal amplifier at one of a plurality of contiguous levels selected by level control signals from a signal source, the amplification of the Rf signal amplifier being related to a drive current signal provided by current amplifying means, and the current amplifying means varying the magnitude of the drive current signal in response to a current control signal, comprising:
   means for obtaining a sample of the amplified RF signal;
   means, coupled to said means for obtaining a sample, for nonlinearly amplifying said sample of said amplified RF signal whereby small values of magnitude of said sample are amplified more than large values of sample magnitude;
   means for rectifying said amplified sample to generate a power magnitude signal having a magnitude related to the RF signal magnitude; and
   means, responsive to said power magnitude signal and the level control signals, for producing the current control signal having a level whereby the RF signal magnitude is maintained at one of the plurality of contiguous levels, 9. Control circuitry in accordance with claim 8 wherein said means for obtaining a sample of the amplified RF signal is a coupling capacitor.

10. Control circuitry in accordance with claim 8 wherein said means for obtaining a sample of the amplified RF signal is a directional coupler.

11. Control circuitry in accordance with claim 10 wherein said nonlinear amplifier means is a logarithmic amplifier.

12. Control circuitry in accordance with claim 8 wherein said means for rectifying further comprises means for full wave rectification of said amplified sample.

13. Control circuitry in accordance with claim 8 wherein said means for producing the current control signal further comprises means for attentuating said power magnitude signal by attenuation steps selected in accordance with the level control signals.

14. Control circuitry in accordance with claim 13 wherein said means for producing the current control signal further comprises a comparator coupled to said means for attenuating for comparing said attenuated power magnitude to a predetermined magnitude to generate the current control signal.

15. A method for controlling the magnitude of a radio frequency (RF) signal in response to control signals, comprising the steps of:
   amplifying the Rf signal to an output magnitude determined by a drive current signal;
   obtaining a sample of said amplified RF signal and amplifying said sample with a nonlinear amplification characteristic such that small values of magnitude of said sample are amplified more than large values of sample magnitude;
   rectifying said amplified sample to generate a power magnitude signal having a magnitude related to said RF signal output magnitude; and
   adjusting said power magnitude signal by an adjustment factor selected by the control signals and producing said drive current signal in response thereto.

16. A method in accordance with the method of claim 15 wherein said step of adjusting said power magnitude signal further comprises the step of attenuating said power magnitude signal by an amount determined by the control signals.

17. A method in accordance with the method of claim 16 wherein said step of producing said drive current signal further comprises the steps of comparing said attenuated power magnitude signal to a predetermined magnitude and amplifying the comparison result to obtain said drive current signal.

18. Circuitry for controlling the magnitude of a radio frequency (RF) signal in response to control signals, comprising:

means, having variable output, for amplifying the RF signal to an output magnitude;

means, coupled to said RF signal amplifying means, for obtaining a sample of said amplified RF signal;

means, coupled to said means for obtaining a sample, for nonlinearly amplifying said sample of said amplified RF signal including differential transistor means biased by a current source, whereby small values of magnitude of said sample are amplified more than large values of sample magnitude;

means, responsive to said amplified sample and including differential transistor full wave rectifier means biased by a current source, for generating a power magitude signal having a magnitude related to said RF signal output magnitude;

means for adjusting said power magnitude signal by attenuating said power magnitude signal by factors selected by the control signals; and means, responsive to said adjusted power magnitude signal, for varying said variable output amplifying means to produce a corresponding RF signal output magnitude.

19. Circuitry in accordance with claim 18 wherein said means for nonlinearly amplifying said sample further comprises a logarithmic amplifier.

20. Circuitry in accordance with claim 18 wherein said means for nonlinearly amplifying said sample further comprises RF bias means.

21. Circuitry in accordance with claim 18 wherein said means for varying said variable output amplifying means further comprises a comparator and a current amplifier.

22. Circuitry in accordance with claim 18 wherein said means for obtaining a sample of said amplified RF signal is a coupling capacitor.

23. Circuitry in accordance with claim 18 wherein said means for obtaining a sample of said amplified RF signal is a directional coupler.

* * * * *